United States Patent [19]

Nishida

[11] Patent Number: 4,927,786
[45] Date of Patent: May 22, 1990

[54] PROCESS FOR THE FORMATION OF A SILICON-CONTAINING SEMICONDUCTOR THIN FILM BY CHEMICALLY REACTING ACTIVE HYDROGEN ATOMS WITH LIQUEFIED FILM-FORMING RAW MATERIAL GAS ON THE SURFACE OF A SUBSTRATE

[75] Inventor: Shoji Nishida, Nagahama, Japan

[73] Assignee: Canon Kabushiki Kaisha, Tokyo, Japan

[21] Appl. No.: 425,350

[22] Filed: Oct. 20, 1989

Related U.S. Application Data

[63] Continuation of Ser. No. 355,642, May 23, 1989, abandoned.

[30] Foreign Application Priority Data

May 25, 1988 [JP] Japan ................. 63-123793

[51] Int. Cl.$^5$ .............. H01L 21/00; H01L 21/02; H01L 21/223; H01L 21/383
[52] U.S. Cl. .............................. 437/233; 437/4; 437/108; 437/109; 437/225; 437/228; 437/234; 148/DIG. 122; 427/54.1; 427/331; 427/337
[58] Field of Search ............... 437/4, 5, 108, 109, 437/225, 228, 233, 234, 248; 148/DIG. 122; 427/215, 341

[56] References Cited

U.S. PATENT DOCUMENTS

| | | | |
|---|---|---|---|
| 4,058,418 | 11/1977 | Lindmayer | 437/108 |
| 4,119,744 | 10/1978 | Brissot et al. | 437/233 |
| 4,141,764 | 2/1979 | Authier et al. | 437/85 |
| 4,159,354 | 6/1979 | Milnes et al. | 437/133 |
| 4,676,868 | 6/1987 | Riley et al. | 156/652 |

*Primary Examiner*—Brian E. Hearn
*Assistant Examiner*—B. Everhart
*Attorney, Agent, or Firm*—Fitzpatrick, Cella, Harper & Scinto

[57] ABSTRACT

Disclosed herein is a process for forming a silicon-containing semiconductor thin film, said process comprising the steps of causing a film-forming raw material gas containing silicon atoms as the conventional atoms in the molecule to be adsorbed in liquid form on the cooled substrate surface and subsequently causing the liquefied film-forming raw material gas to react with chemically active hydrogen atoms, thereby solidifying the silicon-containing material and forming a thin film on the substrate surface.

The process of the present invention provides good step coverage and smoothens the substrate surface. It also makes it possible to increase the degree of integration of memory devices, photosensitive devices, image inputting devices, imaging devices, etc. Moreover, it makes it possible to realize the three-dimensional integrated circuits.

10 Claims, 5 Drawing Sheets

PROCESS FOR THE FORMATION OF A SILICON-CONTAINING SEMICONDUCTOR THIN FILM BY CHEMICALLY REACTING ACTIVE HYDROGEN ATOMS WITH LIQUEFIED FILM-FORMING RAW MATERIAL GAS ON THE SURFACE OF A SUBSTRATE

This application is a continuation of application Ser. No. 355,642, filed May 23, 1989, now abandoned.

FIELD OF THE INVENTION

The present invention relates to a process for forming a silicon-containing semiconductor thin film on the surface of a substrate. The process includes the steps of making a film forming raw material gas containing silicon atoms as the constituent atoms in the molecule to be adsorbed in liquid form on the cooled surface of a substrate and subsequently causing the adsorbed gas to chemically react with active hydrogen atoms, thereby solidifying the adsorbed gas to cause the formation of a thin film on the surface of said substrate. The thus formed silicon-containing semiconductor thin film is useful for semiconductor devices, photosensitive devices for electrophotography, line sensors for image inputting, and imaging devices.

BACKGROUND OF THE INVENTION

With the recent development of VLSI (very large scale integrated) devices having a higher degree of integration than before, a great progress has been made in the technology of fabricating silicon wafer substrates. For example, the trench structure and multilayer interconnected structure have become indispensable. At present, the development of the so called three-dimensional IC is an urgent necessity for the realization of desirable VLSI devices of next generation. This IC has the multilevel structure composed of a semiconductor substrate and insulating layers and semiconductor layers formed one on top of the other, with the semiconductor layers electrically connected with one another through holes made in the insulating layers. The conventional semiconductor integrated circuits are produced by the technique which involves the formation of a semiconductor thin film by chemical vapor deposition (CVD) process.

There is a disadvantage for the conventional CVD process (such as low pressure CVD process and plasma CVD process) that it is rather poor in step coverage because the raw material is used in gaseous form and hence the raw material does not migrate well on the substrate surface. This is significant particularly in the case when a semiconductor thin film is formed on the substrate having an irregular surface. The poor step coverage causes troubles when a plurality of films are formed one over another. For example, the deposited film is broken or the elements are dislocated at the stepped part on the substrate surface. This makes it difficult to increase the degree of integration and deteriorates the yields. Moreover, the plasma CVD process has a disadvantage that the material is damaged by the bombardment of ions in the plasma.

SUMMARY OF THE INVENTION

It is an object of the present invention to provide a desired process for depositing a semiconductor thin film of good-quality. The process of the present invention is free of the foregoing disadvantages involved in the conventional process for depositing a semiconductor thin film. It provides good step coverage, smoothens the irregular substrate surface, permits the production of integrated circuits having a higher degree of integration, and improves the yields.

It is another object of the present invention to provide a desired process for depositing a semiconductor thin film of high reliability and good characteristics. The process of the present invention is free of the disadvantage involved in the conventional plasma CVD process. It does not cause damage by the bombardment of ions to the substrate, insulating layer, and semiconductor layer and also to the interface between the semiconductor thin film and the substrate or insulating layer.

The above-mentioned objects are achieved by the process for forming a silicon-containing semiconductor thin film, said process comprising the steps of making a film-forming raw material gas containing silicon atoms as the constituent atoms in the molecule to be adsorbed in liquid form on the cooled surface of a substrate and subsequently causing the liquefied film-forming raw material gas to chemically react with active hydrogen atoms, thereby solidifying the silicon-containing material to cause the formation of a thin film on the surface of said substrate.

The process of the present invention provides good step coverage and smoothens the substrate surface. It also makes it possible to increase the degree of integration of memory devices, photosensitive devices, image inputting devices, imaging devices, etc. Moreover, it makes it possible to realize the three-dimensional integrated circuits.

DETAILED DESCRIPTION OF THE INVENTION

The present invention has been completed as a result of extensive studies which were conducted to address the problems encountered in the conventional process for depositing a semiconductor thin film and also to achieve the above-mentioned objects.

The gist of the present invention resides in a process for forming a silicon-containing semiconductor thin film, said process comprising the steps of making a film-forming raw material gas containing silicon atoms as the constituent atoms in the molecule to be adsorbed in liquid form on the cooled surface of a substrate and subsequently causing the liquefied film-forming raw material gas to chemically react with active hydrogen atoms, thereby solidifying the silicon containing material to cause the formation of a thin film on the surface of said substrate.

According to the process of the present invention, a film-forming raw material gas containing silicon atoms is brought into contact with the previously cooled substrate surface on which it is liquefied and adsorbed to cause the formation of a film. The liquefied gas wets the substrate surface well and spreads flat over the irregularities of the substrate surface.

Figure 1A:
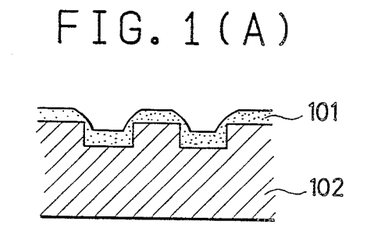
FIGS. 1(A) and 1(B) are schematic explanatory view for the principle of the process according to the present invention.
Figure 1B:
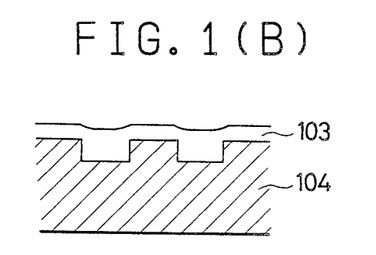

The conventional CVD process is poor in step coverage as shown in FIG. 1(A), because it resorts to active gaseous molecules for film deposition. The gaseous molecules essentially have a large contact angle with respect to the substrate surface and the stepped parts on the substrate surface have a large free surface energy. By contrast, the process of the present invention provides good step coverage as shown in FIG. 1(B), because it employs liquid molecules. Liquid molecules have a small contact angle with respect to the substrate surface and hence spread over the substrate surface like water, forming a flat substrate surface.

The film-forming raw material gas containing silicon atoms used in the present invention includes any substance that meets the following requirements: it should be in a gaseous or liquid state at normal temperature under normal pressure: it should be easily gasified by an adequate vaporizer: it should decompose upon chemical reaction with chemically active hydrogen atoms, thereby forming a deposited film: it should have a comparatively high boiling point: and it should become liquefied when cooled with dry ice or liquefied nitrogen. Examples of such raw material include linear or cyclic silane compounds and their derivatives in which hydrogen atoms are partly or entirely substituted with halogen atoms. To be concrete, they include linear and cyclic silanes represented by the formula: $Si_uH_{2u+2}$ or $Si_vH_{2v}$, where u is an integer of 2 or above, and v is an integer of 3 or above; linear and cyclic silanes represented by the formula: $Si_uH_xY_y$, where Y denotes at least one element selected from F, Cl, Br, and I; $x+y=2u$ or $2u+2$; and u is defined as above; linear halogenated silicon compounds represented by the formula: $Si_uY_{2u+2}$, where u and Y are the same meanings as defined above; and cyclic halogenated silicon compounds represented by the formula: $Si_vY_{2v}$, where v and Y are the same meanings as defined above.

Specifically, they are, for example, $Si_2H_6$, $Si_2F_6$, $(SiF_2)_5$, $Si_2H_3F_3$, $Si_2Cl_6$, $(SiBr_2)_5$, $Si_3H_4Br_2$, $Si_2Br_6$, $Si_2Cl_3F_3$, and $Si_2I_6$, which are in the gaseous state or gasified easily. Additional examples of the raw material that can be used in the present invention include lower silane and halogenated silicon compounds such as $SiH_4$, $SiF_4$, $SiH_3F$, and $SiHCl_3$. However, they are not preferable in practical use because they have a comparatively small molecular weight and hence have a low boiling point and they need a considerably low temperature for liquefaction under reduced pressure.

The above-mentioned raw material substance may be used in combination with an inert gas such as He, Ar, and Ne so as to control its partial pressure.

According to the process of the present invention, the above-mentioned raw material substance is chemically reacted with chemically active hydrogen atoms. Such active hydrogen atoms are formed by glow discharge or microwave discharge in hydrogen gas ($H_2$), by irradiation of $H_2$ gas with ultraviolet rays, or by reaction of $H_2$ gas with a metal. The hydrogen atoms may be efficiently supplied through decomposition of a silane compound such as $SiH_4$ and $Si_2H_6$ by glow discharge or microwave discharge. The hydrogen atoms are formed in the course of decomposition as follows.

, where e denotes a high-speed electron existing in the glow discharge or microwave discharge and having energy enough to excite and decompose $SiH_4$ or $Si_2H_6$.

According to the process of the present invention, the film-forming raw material substance (gas) is chemically reacted with active hydrogen atoms in any of the following two manners for the formation of a semiconductor thin film.

That is, the first manner involves the steps of making the raw material gas to be adsorbed onto the cooled surface of a substrate, thereby causing the liquefied raw material gas to cover the substrate surface, and introducing active hydrogen atoms onto the substrate surface, thereby forming a solid semiconductor thin film through reaction and decomposition. The second manner involves the steps of introducing the raw material gas and active hydrogen atoms into the atmosphere in which the substrate is placed for film formation, permitting the two reactants to react to form an intermediate substance, causing the intermediate substance to be adsorbed and liquefied on the substrate surface, and causing active hydrogen atoms to react, thereby forming a solid semiconductor thin film.

According to the process of the present invention, it is possible to perform doping with impurity atoms during film forming, if necessary. The impurity atoms may be obtained from any substance which meets the following requirements; it should be in a gaseous or liquid state at normal temperature under normal pressure: it should be easily gasified by an adequate vaporizer: it should decompose upon chemical reaction with active hydrogen atoms, thereby liberating the impurity elements: it should have a comparatively high boiling point: and it should become liquefied when cooled. Preferred examples of the doping substance include $BCl_3$, $BBr_3$, $B_2H_6$, and $BF_3$ which contain p-type impurity elements, and $PCl_3$, $PH_3$, $PF_3$, $SbH_3$, $SbCl_5$, $AsH_3$, $AsCl_3$, $AsF_3$, and $AsF_5$ which contain n type impurity elements. These doping substances may be used alone or in combination with one another.

The impurity substance for doping the semiconductor thin film should be used in an appropriate amount determined upon the film-forming conditions; the kind of the film-forming raw material gas and/or impurity substance, the type of the film to be formed and the like. However, in general, the impurity substance is used in an amount of preferably $1/10^6$ to $1/10$, preferably $1/10^5$ to $1/20$, and most preferably $1/10^5$ to $1/50$ by volume ratio versus the film forming raw material.

According to the process of the present invention, it is possible to form a single layer comprising a thin film on the substrate or to form two different layers comprising two different thin films being laminated one over the other on the substrate. In the latter case, the first layer formed on the substrate may be annealed before the second layer is formed on the first layer.

The substrate used in the present invention may be either conductive or insulating; but it should be durable over the temperature range from $-196°$ C. to room temperature. Examples of the conductive substrate include NiCr, stainless steel, Al, Cr, Mo, Au, In, Nb, Ta, V, Ti, Pt, Pd and alloys thereof. Examples of the insulating substrate include film or sheet of synthetic resin such as polyester, polyethylene, polycarbonate, cellulose acetate. polypropylene, polyvinyl chloride, polyvinylidene chloride, polystyrene, and polyamide, glass and ceramics. In addition, silicon and other semiconductors can also be used as the substrate.

The inner pressure of the film-forming space wherein a substrate onto which a film is to be formed upon forming the film should be properly determined with due regards to the pressure and flow rate of the film-forming raw material gas, inert gas, hydrogen supplying gas, and impurity substance. However, in general, it is preferably $1 \times 10^{-3}$ to $10^2$ Torr, more preferably $1 \times 10^{-2}$ to 30 Torr, and most preferably $5 \times 10^{-2}$ to 10 Torr.

During the film-forming operation, the substrate should be kept at an appropriate temperature ($T_s$) determined according to the kind and partial pressure of the film-forming raw material gas and the kind of the substrate to be used.

Figure 2:
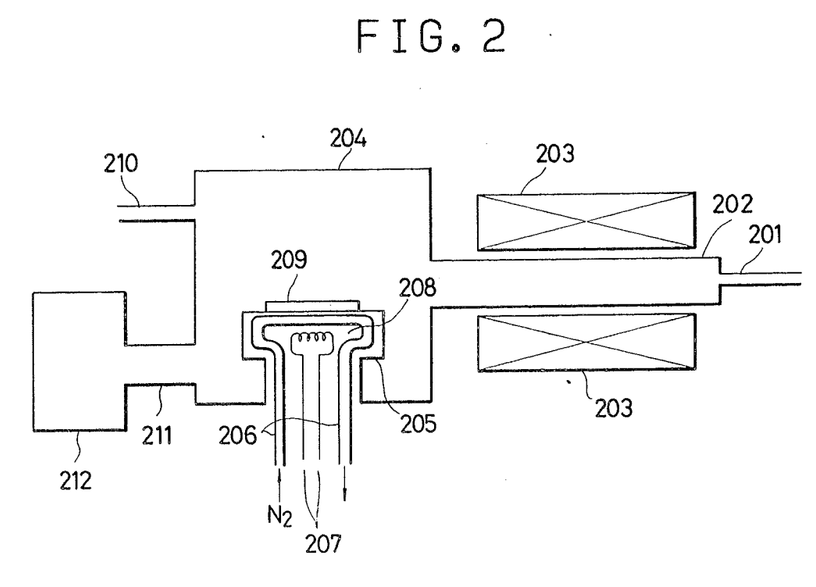
FIGS. 2, 3 and 4 are schematic representations showing the apparatuses suitable for practicing the process according to the present invention.
Figure 3:
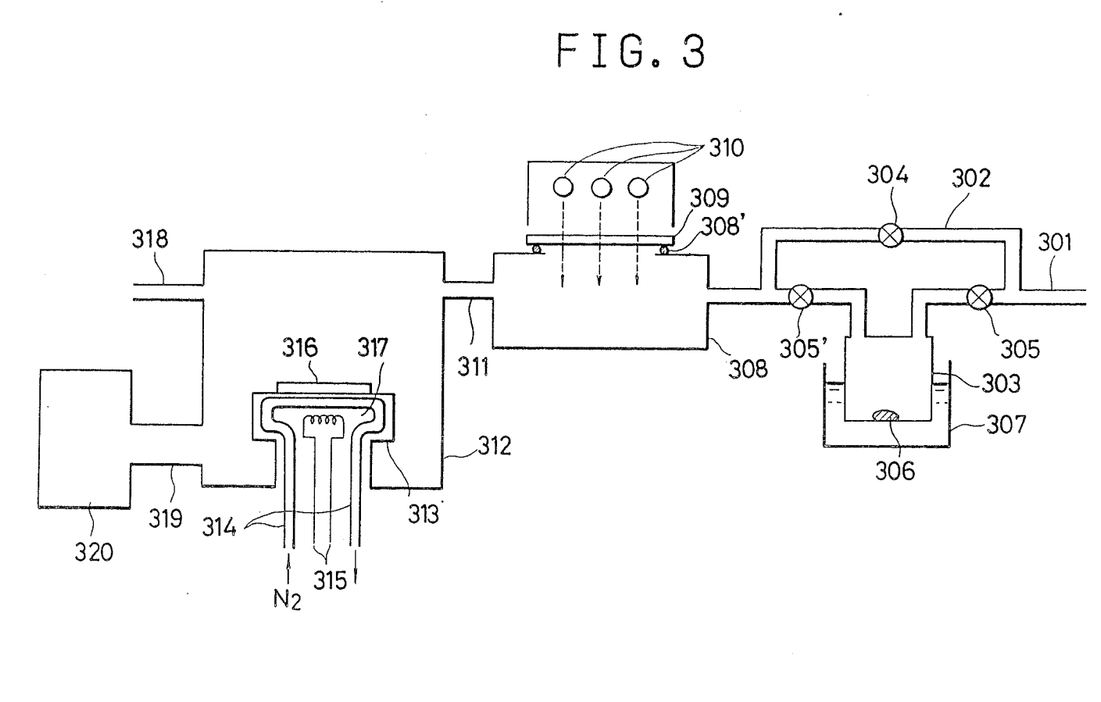
Figure 4:
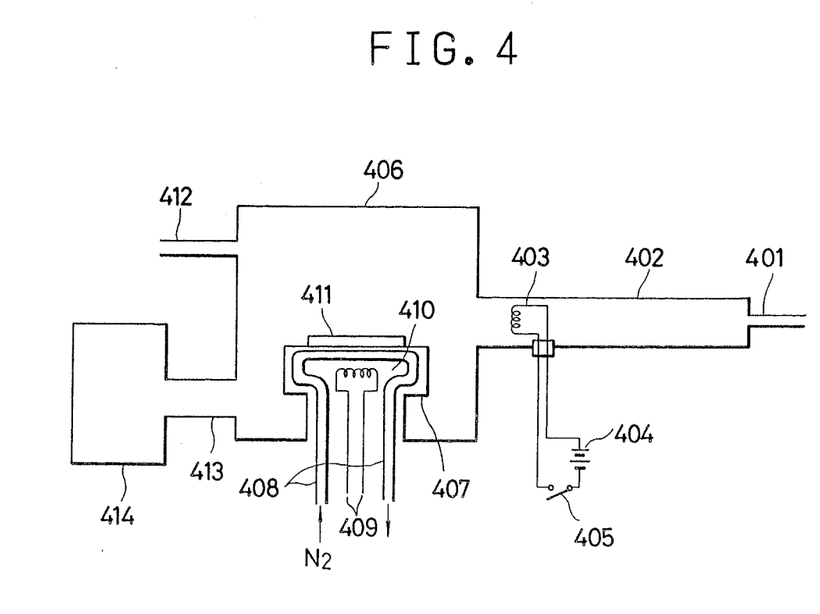

The process of the present invention mentioned above may be carried out using a proper apparatus. Preferred examples of the apparatus are shown in FIGS. 2 to 4.

The apparatus shown in FIG. 2 will be explained in the following. There is shown the hydrogen feed pipe 201 which is connected to the hydrogen atoms-generating space 202. There is shown the microwave generator 203 installed around the hydrogen atoms-generating space 202. The microwave generator 203 imparts electromagnetic wave energy to the hydrogen gas introduced into the space 202 so as to generate active hydrogen atoms through discharge. The thus generated hydrogen atoms are transferred to the film-forming space 204. There is shown the feed pipe 210 for the silicon-containing film-forming raw material gas, which is connected to the film forming chamber 204 enclosing the film-forming space. There is shown the substrate holder 205 on which the substrate 209 is placed. The substrate holder 205 has the built-in heater 208 connected the power source through the conductor 207. The substrate holder 205 also has the built-in cooling pipe 206 which cools the substrate 209. The cooling pipe 206 circulates a coolant (such as nitrogen gas which has passed through liquefied nitrogen). If necessary, the heater 208 and the cooling pipe 206 may be used simultaneously to heat the substrate to a desired temperature. The film-forming chamber 204 is provided with the evacuating pipe 211 having an evacuation valve (not shown), and the evacuating pipe 211 is connected to the vacuum pump 210.

The apparatus shown in FIG. 3 will be explained in the following. This apparatus is a modification of the apparatus shown in FIG. 2. It is designed such that the active hydrogen atoms are generated by photochemical reaction induced by ultraviolet rays in place of electromagnetic wave. There is shown the hydrogen feed pipe 301 which is connected to the mercury reservoir 303 through the stop valve 305. The hydrogen gas feed pipe 301 supplies hydrogen gas to the mercury reservoir 303. The hydrogen gas goes to the hydrogen atoms-generating space 308 through the stop valve 305', accompanying a slight amount of mercury vapor evaporating from the mercury 306 of the mercury reservoir 303. The amount of mercury vapor in the mercury reservoir 303 is controlled by the thermostat bath 307 surrounding the mercury reservoir 303. There is shown the by-pass pipe 302 which permits hydrogen gas to be introduced directly into the hydrogen atoms-generating space 308. The hydrogen gas as introduced into the hydrogen atoms-generating space 308 is irradiated with ultraviolet rays generated by the UV lamps 310 through the synthetic quartz plate 309 sealed with the 0-ring 308'. Upon irradiation, the hydrogen atoms-supplying gas is excited and decomposed into active hydrogen atoms. The resultant hydrogen atoms successively enter the film-forming chamber 312 through the hydrogen atoms feed pipe 319. The reason why the hydrogen atoms-supplying gas is mixed with a slight amount of mercury vapor is that hydrogen gas alone has a low absorption coefficient for ultraviolet rays. Therefore, mercury is excited by ultraviolet rays to generate excited mercury atoms which transfer energy to the hydrogen gas to thereby effectively excite it resulting in generating active hydrogen atoms. This technique is called "mercury sensitization method" which is commonly used in the field of optics.

The apparatus shown in FIG. 4 will be explained in the following. This apparatus is a modification of the apparatus shown in FIG. 3. It is designed such that the active hydrogen atoms are generated by the reaction of hydrogen molecules with a thin metal wire (which functions as a catalyst) in place of the excitation by electro-magnetic wave. The thin metal wire in this apparatus is the coil 403 of tungsten. Hydrogen atoms are adsorbed onto the metal surface, and the adsorbed hydrogen atoms are released when the metal coil 403 is heated by an electric current supplied from the power source 404 through the switch 405 outside the hydrogen atoms-generating space 402. The released hydrogen atoms enter the film-forming space 406.

DESCRIPTION OF THE PREFERRED EMBODIMENTS

The invention will be described in more detail with reference to the following examples which were carried out using one of the apparatuses shown in FIGS. 2 to 4. The present invention is not restricted to the examples.

EXAMPLE 1

Figure 5:
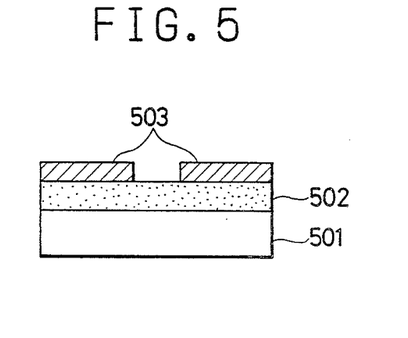
FIG. 5 is a schematic cross-sectional view illustrating the layer structure of the gap cell produced by the process according to the present invention.

A silicon film was deposited using the apparatus shown in FIG. 2 to form a gap cell as shown in FIG. 5. The gap cell was tested for electrical properties.

The substrate 209, which is a 7059 glass substrate made by Corning Glass Works, was placed on the substrate holder 205 cooled with nitrogen circulating through liquefied nitrogen. The substrate temperature was kept at $-120°$ C. by properly energizing the heater 208. The film-forming chamber was evacuated to $10^{-5}$ Torr. $Si_3H_6$ (trisilane) as the silicon-containing film-forming raw material gas, which had previously been vaporized by a proper vaporizer, was introduced together with an Ar carrier gas into the film-forming chamber 204 through the feed pipe 210. The total pressure in the film-forming chamber was 10 Torr and the partial pressure of $Si_3H_6$ was 1 Torr. The gas feeding was continued for 20 minutes. The film-forming chamber 204 was evacuated for 3 hours and then charged with hydrogen gas through the hydrogen feed pipe 201. The microwave generator 203 was energized to bring about discharge for 40 minutes. The flow rate of the hydrogen gas was 250 sccm, the discharge power was 160 W (pulse oscillation), and the pressure in the film-forming chamber was 0.2 Torr. After discharging was suspended, the film-forming chamber 204 was evacuated again, the circulation of the nitrogen gas in the cooling pipe 206 was suspended, and the substrate 209 was annealed at 250° C for 1 hour by energizing the heater 208. Thus there was obtained a silicon film 502 about 0.8 μm thick. On the surface of the silicon film 502 were formed aluminum electrodes 503, 0.1 μm thick, by the ordinary vacuum deposition. Thus there was obtained a gap cell having a gap width of 50 μm.

The thus obtained silicon film was tested for electrical properties. It was found to have a dark conductivity ($\sigma_d$) of $2\times 10^{-9}$ to $4\times 10^{-8}$ S/cm and a photoconductivity ($\sigma_p$) of $4\times 10^{-5}$ to $5\times 10^{-4}$ S/cm under AM-1 irradiation. These data suggest that the silicon film is a good functional thin film. The surface of the silicon film was examined by reflection electron diffraction. A hollow diffraction pattern was obtained, which indicates that the silicon film is amorphous.

The same procedure as mentioned above was repeated, except that the hydrogen gas was replaced by SiH$_4$ for hydrogen atoms generation. In other words, SiH$_4$ was fed at a flow rate of 50 sccm through the hydrogen feed pipe 201. There was obtained a silicon film about 0.7 μm thick. It was found to have a dark conductivity ($\sigma_d$) of $4\times 10-9$ to $10-8$ S/cm and a photoconductivity ($\sigma_p$) of $5\times 10-5$ to $10^{-4}$ S/cm under AM-1 irradiation.

The same procedure as mentioned above was repeated, except that the glass substrate was replaced by a silicon wafer substrate having periodically formed grooves, 5 μm deep and 1 μm wide, as shown in FIG. 1(A). After the film formation, the substrate was vertically cut to observe the section. The section is shown in FIG. 1(B). It is noted that the grooves are filled up with silicon and the substrate surface is much smoother than that obtained by the conventional plasma CVD process.

This example demonstrates that the process of the present invention forms a silicon film having good electrical characteristics which smoothens the irregularities on the substrate surface.

EXAMPLE 2

A silicon film was deposited on a glass substrate using the apparatus shown in FIG. 3. The film-forming raw material gas was Si$_2$H$_6$, which was introduced into the film-forming chamber together with hydrogen atoms. The substrate temperature was kept at $-100°$ C. As in Example 1, the film-forming chamber 311 was evacuated to $10^{-5}$ Torr or below. With the stop valves 305 and 305' open, hydrogen gas was fed at a flow rate of 200 sccm through the hydrogen feed pipe 301. The hydrogen gas was irradiated in the hydrogen atoms-generating space 308 by means of the ultra-violet lamps 310. The thermostat bath 307 was kept at 50° C. Then, Si$_2$H$_6$ and Ar were introduced into the film-forming chamber 312 at flow rates of 5 sccm and 80 sccm, respectively, through the film-forming raw material gas feed pipe 318. The total pressure in the film-forming chamber was kept at 2 Torr by adjusting the vacuum pipe 319 and vacuum pump 320. Film forming was carried out for 40 minutes. The supply of Si$_2$H$_6$ and Ar to the film-forming chamber was suspended and the film-forming chamber was filled with hydrogen containing hydrogen atoms. The total pressure of the film-forming chamber was adjusted to 0.5 Torr again. After standing for 30 minutes, and the substrate 316 was annealed at 250° C. for 1 hour while the film-forming chamber 312 was continuously evacuated, with the stop valves 305 and 305' closed. Thus there was obtained a silicon film 0.6 μm thick.

The thus obtained silicon film was processed in the same manner as in Example 1 to form a gap cell. The gap cell was tested for electrical properties. It was found to have a dark conductivity ($\sigma_d$) of $10^{-9}$ to $10^{-8}$ S/cm and a photoconductivity ($\sigma_p$) of $2\times 10^{-5}$ to $10^{-4}$ S/cm. These data suggest that the silicon film is a good functional thin film. The result of reflection electron diffraction indicates that the silicon film is amorphous.

EXAMPLE 3

A doped silicon film was deposited using the apparatus shown in FIG. 3. The doping gas for the p-type impurity was B$_2$H$_6$ in an amount of $1/10^2$ of Si$_2$H$_6$ and the doping gas for the n-type impurity was PH$_3$ in an amount of $3/10^3$ of Si$_2$H$_6$. (The doping gas may also be introduced together with hydrogen through the hydrogen feed pipe 301.) After film deposition, a gap cell was formed in the same manner as in Examples 1 and 2. The gap cell was tested for electrical properties. The one doped with B$_2$H$_6$ was found to have a dark conductivity ($\sigma_d$) of $10^{-4}$ to $3\times 10^{-4}$ S/cm and a photoconductivity ($\sigma_p$) of about $6\times 10^{-4}$ S/cm. The one doped with PH$_3$ was found to have a dark conductivity ($\sigma_d$) of $4\times 10^{-3}$ to $10-2$ S/cm and a photoconductivity ($\sigma_p$) of $10^{-2}$ S/cm. These data suggest that the doping enables the control of valence electrons in the silicon film.

The silicon film was also tested for thermoelectromotive force. The results indicate that the film doped with B$_2$H$_6$ is p-type and the film doped with PH$_3$ is n-type.

EXAMPLE 4

A diode of pin structure was prepared using the apparatus shown in FIG. 4. A p-layer, i-layer (non-doped layer), and n-layer were formed one over another in the order mentioned in the same manner as in Examples 2 and 3. The substrate is a glass substrate with an ITO transparent conductive film, 0.15 μm thick, deposited thereon by sputtering. The Si$_2$H$_6$ gas was introduced into the film-forming chamber 406. Simultaneously, hydrogen atoms which had been generated by the tungsten coil 403 were introduced into the film-forming chamber 406 from the hydrogen atoms generating space 402. Each film was formed under the conditions shown in Table 1. After deposition, the layers were annealed at 250° C. for 20 minutes in a vacuum, and the annealing was continued for another 40 minutes at 250° C. Finally, the n-layer was coated with an Al layer, 0.3 μm thick, as an electrode by the ordinary vacuum deposition process.

The thus obtained pin diode was tested for photoelectromotive force, with the p-layer (adjacent to the glass substrate) irradiated with the AM-1 light source. The fact that the diode produces the photoelectromotive force effect was confirmed by an open circuit voltage ($V_{oc}$) of 0.72 V, a short-circuit current ($I_{sc}$) of 6.5 mA/cm$^2$, a curvature factor (FF) of 0.43, and an efficiency ($\eta$) of 2.0%.

This example demonstrated that the process of the present invention enables the formation of a semiconductor thin film which can be fabricated into a functional device.

EXAMPLE 5

Figure 6:
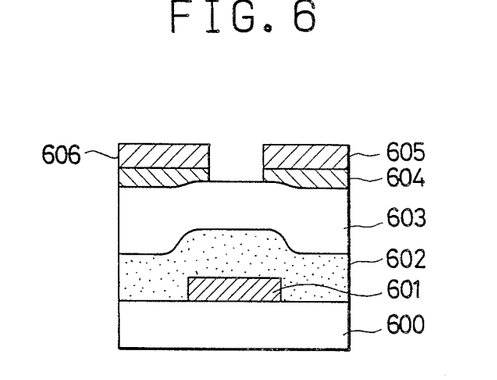
FIG. 6 is a schematic cross-sectional view illustrating the gate-type thin film transistor produced by the process according to the present invention.

A lower gate-type thin film transistor constructed as shown in FIG. 6 was formed using the apparatus shown in FIG. 4. At first, the substrate 600 (quartz plate) was coated with a 5000 Å thick aluminum film as the gate electrode 601 by the ordinary vacuum deposition process. After patterning, the electrode layer 601 was coated with a 3000 Å thick dielectric layer 602 (A-Si:H:N layer) which was formed from $NH_3$ gas and $SiH_4$ gas under the conditions shown in Table 2. Subsequently, the substrate coated with the dielectric layer 602 was placed on the substrate holder 407 in the apparatus shown in FIG. 4. On the dielectric layer 602 was formed the active layer (i layer) 603 under the same conditions as shown in Table 1 in Example 4. Then, the ohmic contact layer (n layer) 604 was formed in the same manner as in Example 4. After deposition, the layers were annealed at 250° C. for 20 minutes in a vacuum, and the annealing was continued for another 40 minutes at 250° C., in the same manner as in Example 4. The ohmic contact layer 604 was coated with a 1000 Å thick aluminum layer by the ordinary vacuum deposition process, and the source electrode 605 and the drain electrode 606 were formed by the photolithography technique. The thus formed transistor was found to have a gate width (W) of 600 μm and a gate length (L) of 20 μm.

The transistor was tested for drain current ($I_D$) at varied gate voltages ($V_G$). The ratio of the maximum drain current ($I_D$) to the minimum drain current ($I_D$) at a drain voltage ($V_D$) of 10 V was $5 \times 10^4$ to $2 \times 10^5$. The field effect mobility calculated from the characteristics was 1 to 2 cm²/V.sec. These values are equal to those of the thin-film transistor based on the A-Si film deposited by the plasma CVD process.

It should be noted from FIG. 6 that the A-Si:H:N layer 602 formed by the conventional plasma CVD process is poor in step coverage and considerably sharp steps remain on the edges of the lower gate electrode 601. The steps become greatly smoothened in the i-layer 602 and n-layer 604 deposited thereon by the process of the present invention. The source electrode 605 and the drain electrode 606 formed on the top are so flat that they do not cause problems associated with steps.

EXAMPLE 6

A photosensitive body for electrophotography was prepared by using the apparatus shown in FIG. 4. A p-layer and i-layer (non-doped layer) were deposited one over the other on a 5 mm thick aluminum substrate under the same conditions as in Example 2 and 3. The $Si_2H_6$ gas was introduced into the film-forming chamber 406 through the feed pipe 412, and simultaneously hydrogen atoms generated by the tungsten coil 403 were introduced into the film-forming chamber 406 from the hydrogen atoms-generating space 402. Each layer was formed under the conditions shown in Table 3. After deposition, the layers were annealed at 250° C. for 20 minutes in a vacuum, and the annealing was continued for another 40 minutes at 250° C.

The photosensitive body was tested for characteristic properties according to the Carlson process. This process involves the steps of positively charging the photosensitive body with corona discharge at 6 kv and, about 0.2 seconds later, irradiating the charged photosensitive body with white light of 0.8 Lux-sec. The dark potential was 350 V and the light potential was 10 V. These data indicate that the photosensitive body has good characteristic properties for electrophotography.

TABLE 1

| | Raw material | Flow rate (sccm) | $H_2$ flow rate (sccm) | Pressure in film-forming chamber (Torr) | Temperature of substrate (°C.) | Tungsten current (A) | Film thickness (μm) |
|---|---|---|---|---|---|---|---|
| p | $Si_2H_6$ | 5 | 200 | 2 | −100 | 5 | ~0.02 |
|   | Ar | 80 | | | | | |
|   | $B_2H_6/Si_2H_6$ | 10,000 ppm | | | | | |
| i | $Si_2H_6$ | 5 | 200 | 2 | −100 | 5 | 0.4 |
|   | Ar | 80 | | | | | |
| n | $Si_2H_6$ | 5 | 200 | 2 | −100 | 5 | 0.05 |
|   | Ar | 80 | | | | | |
|   | $PH_3/Si_2H_6$ | 3,000 ppm | | | | | |

TABLE 2

| Raw materials | Flow rate (sccm) | Discharge power (W/cm²) | Internal pressure (Torr) | Substrate temperature (°C.) |
|---|---|---|---|---|
| $SiH_4$ gas | 6 | 0.1 | 0.2 | 200 |
| $NH_3$ gas | 8 | | | |

TABLE 3

| | Raw material | Flow rate (sccm) | $H_2$ flow rate (sccm) | Pressure in film-forming chamber (Torr) | Temperature of substrate (°C.) | Tungsten current (A) | Film thickness (μm) |
|---|---|---|---|---|---|---|---|
| p | $Si_2H_6$ | 5 | 200 | 2 | −100 | 5 | 3 |
|   | Ar | 80 | | | | | |
|   | $B_2H_6/Si_2H_6$ | 500 ppm | | | | | |
| i | $Si_2H_6$ | 5 | 200 | 2 | −100 | 5 | 20 |
|   | Ar | 80 | | | | | |

What is claimed is:

1. A process for forming a silicon-containing semiconductor thin film, said process which comprises the steps of making a film-forming raw material gas containing silicon atoms as the constituent atoms in the molecule to be adsorbed in liquid form on the cooled surface of a substrate and subsequently causing the liquefied film-forming raw material to chemically react with active hydrogen atoms to thereby solidify the silicon-containing material and form a silicon-containing semiconductor thin film on the surface of the substrate.

2. A process for forming a semiconductor thin film according to claim 1, wherein said film-forming raw material is a member selected from the group consisting of compounds represented by the formula: $Si_uH_{2u+2}$ and compounds represented by the formula: $Si_vH_{2v}$, where u is an integer of 2 or above, and v is an integer of 3 or above.

3. A process for forming a semiconductor thin film according to claim 1, wherein said film-forming raw material is a member selected from the group consisting of compounds represented by the formula: $Si_uH_xY_y$, where Y denotes an element selected from the group consisting of F, Cl, Br and I; $x+y=2u$ or $2u+2$; and u is an integer of 2 or above.

4. A process for forming semiconductor thin film as according to claim 1, wherein said film-forming raw material is a member selected from the group consisting of compounds represented by the formula: $Si_uY_{2u+2}$ and compounds represented by the formula: $Si_vY_{2v}$, where Y denotes an element selected from the group consisting of F, Cl, Br and I, u is an integer of 2 or above, and v is an integer of 3 or above.

5. A process for forming a semiconductor thin film according to claim 1, wherein said active hydrogen atoms are formed by glow discharge or microwave discharge in hydrogen gas, by irradiation of hydrogen gas with ultraviolet rays, or by reaction of hydrogen gas with a metal.

6. A process for forming a silicon-containing semiconductor thin film, said process which comprises the steps of introducing a film-forming raw material gas containing silicon atoms as the constituent atoms in the molecule and active hydrogen atoms into a film-forming space wherein a substrate having a cooled surface on which a film is to be formed is placed, permitting said film-forming raw material gas and said active hydrogen atoms to chemically react and form an intermediate substance, causing said intermediate substance to be adsorbed and liquefied on said cooled surface of substrate and chemically reacting said intermediate substance liquified on said cooled surface of substrate with active hydrogen atoms to form a silicon-containing semiconductor film on said substrate.

7. A process for forming a silicon-containing semiconductor thin film according to claim 6, wherein said film-forming raw material is a member selected from the group consisting of compounds represented by the formula: $Si_uH_{2u+2}$ and compounds represented by the formula: $Si_vH_{2v}$, where u is an integer of 2 or above, and v is an integer of 3 or above.

8. A process for forming a silicon-containing semiconductor thin film according to claim 6, wherein said film-forming raw material is a member selected from the group consisting of compounds represented by the formula: $Si_uH_xY_y$, where Y denotes an element selected from the group consisting of F, Cl, Br and I: $x+y=2u$ or $2u+2$; an du is an integer of 2 or above.

9. A process for forming a silicon-containing semiconductor thin film according to claim 6, wherein said film-forming raw material is a member selected from the group consisting of compounds represented by the formula: $Si_uY_{2u+2}$ and compounds represented by the formula $Si_vY_{2v}$, where Y denotes an element selected from the group consisting of F, Cl, Br and I, u is an integer of 2 or above, and v is an integer of 3 or above.

10. A process for forming a silicon-containing semiconductor thin film according to claim 6, wherein said active hydrogen atoms are formed by glow discharge or microwave discharge in hydrogen gas, by irradiation of hydrogen gas with ultraviolet rays, or by reaction of hydrogen gas with a metal.

* * * * *

UNITED STATES PATENT AND TRADEMARK OFFICE
CERTIFICATE OF CORRECTION

PATENT NO. : 4,927,786
DATED : May 22, 1990
INVENTOR(S) : SHOJI NISHIDA

Page 1 of 3

It is certified that error appears in the above-identified patent and that said Letters Patent is hereby corrected as shown below:

Title page:

IN [30] FOREIGN APPLICATION PRIORITY DATA

"Japan ............................. 63-123793" should read
--Japan ............................. 63-125793--.

IN [57] ABSTRACT

Line 4, "conventional atoms" should read
--constituent atoms--.

COLUMN 1

Line 16, "film forming" should read --film-forming--.
Line 35, "so called" should read --so-called--.

COLUMN 3

Line 39, "are" should read --have--.
Line 42, "are" should read --have--.

COLUMN 4

Line 12, ", where" should read --where--.
Line 49, "n type impurity elements." should read
--n-type impurity elements.--.

COLUMN 5

Line 42, "film forming chamber 204" should read
--film-forming chamber 204--.
Line 56, "pump 210." should read --pump 212.--.

UNITED STATES PATENT AND TRADEMARK OFFICE
CERTIFICATE OF CORRECTION

PATENT NO. : 4,927,786
DATED : May 22, 1990
INVENTOR(S) : SHOJI NISHIDA

It is certified that error appears in the above-identified patent and that said Letters Patent is hereby corrected as shown below:

COLUMN 7

Line 27, "4 X 10-9 to 10-8 S/cm" should read
--4 X $10^{-9}$ to $10^{-8}$ S/cm--.
Line 28, "5 X 10-5 to $10^{-4}$ S/cm" should read
--5 X $10^{-5}$ to $10^{-4}$ S/cm--.
Line 50, "chamber 311" should read --chamber 312--.

COLUMN 8

Line 19, "$PH_3$in" should read --$PH_3$ in--.
Line 28, "$PH_3$was" should read --$PH_3$ was--.
Line 29, "4 X $10^{-3}$to 10-2 S/cm" should read
--4 X $10^{-3}$ to $10^{-2}$ S/cm--.
Line 48, "hydrogen atoms generating space" should read
--hydrogen atoms-generating space--.

COLUMN 10

Line 8, "5 mm thick" should read --5-mm thick--.
Line 22, "6 kv" should read --6kV--.

COLUMN 11

Line 20, "semiconductor thin film as" should read
--a semiconductor thin film--.

UNITED STATES PATENT AND TRADEMARK OFFICE
CERTIFICATE OF CORRECTION

PATENT NO. : 4,927,786
DATED : May 22, 1990
INVENTOR(S) : SHOJI NISHIDA

It is certified that error appears in the above-identified patent and that said Letters Patent is hereby corrected as shown below:

COLUMN 12

Line 22, "I:" should read --I;--.
Line 23, "an du" should read --and u--.

Signed and Sealed this

Twenty-fourth Day of November, 1992

Attest:

DOUGLAS B. COMER

Attesting Officer

Acting Commissioner of Patents and Trademarks